United States Patent
Yasuda et al.

(10) Patent No.: US 9,223,213 B2
(45) Date of Patent: Dec. 29, 2015

(54) METHOD OF MANUFACTURING POLYMER FOR LITHOGRAPHY, METHOD OF MANUFACTURING RESIST COMPOSITION, AND METHOD OF MANUFACTURING SUBSTRATE HAVING PATTERN

(71) Applicant: Mitsubishi Rayon Co., Ltd., Chiyoda-ku (JP)

(72) Inventors: Atsushi Yasuda, Yokohama (JP); Kazuaki Mukai, Yokohama (JP)

(73) Assignee: Mitsubishi Rayon Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/452,983

(22) Filed: Aug. 6, 2014

(65) Prior Publication Data

US 2015/0044608 A1  Feb. 12, 2015

(30) Foreign Application Priority Data

Aug. 9, 2013  (JP) .................. 2013-166657

(51) Int. Cl.
*G03F 7/004* (2006.01)
*B01D 61/14* (2006.01)
*G03F 7/038* (2006.01)
*C08F 220/18* (2006.01)
*B01D 61/22* (2006.01)

(52) U.S. Cl.
CPC ............... *G03F 7/038* (2013.01); *B01D 61/14* (2013.01); *B01D 61/147* (2013.01); *B01D 61/22* (2013.01); *C08F 220/18* (2013.01)

(58) Field of Classification Search
CPC ....... G03F 7/004; G03F 7/038; C08F 220/14; C08F 220/18; B01D 61/14; B01D 61/147; B01D 61/18; B01D 61/22
USPC ................. 430/270.1; 526/270; 210/767, 768
See application file for complete search history.

(56) References Cited

U.S. PATENT DOCUMENTS

| | | | |
|---|---|---|---|
| 6,706,824 B1* | 3/2004 | Pfaendner et al. | 525/437 |
| 7,741,429 B2* | 6/2010 | Russell et al. | 528/395 |
| 7,960,494 B2* | 6/2011 | Yamagishi et al. | 528/272 |
| 8,530,134 B2* | 9/2013 | Teranishi | 430/270.1 |
| 9,023,578 B2* | 5/2015 | Katou et al. | 430/270.1 |
| 2013/0183528 A1* | 7/2013 | Echigo et al. | 428/402 |
| 2013/0224654 A1* | 8/2013 | Yasuda et al. | 430/270.1 |
| 2014/0335453 A1* | 11/2014 | Ogihara et al. | 430/270.1 |

FOREIGN PATENT DOCUMENTS

| | | |
|---|---|---|
| JP | 2006-199764 | 8/2006 |
| JP | 2006-225516 | 8/2006 |
| JP | 2010-159393 | 7/2010 |

* cited by examiner

*Primary Examiner* — Amanda D Walke
(74) *Attorney, Agent, or Firm* — Oblon, McClelland, Maier & Neustadt, L.L.P.

(57) ABSTRACT

[Object]
Provided is a method of manufacturing a polymer for lithography having reduced residual amounts of un-reacted monomers and a poor solvent used for a purification process.

[Solving Means]
The method of manufacturing a polymer for lithography includes a polymerization process of obtaining a polymerization reaction solution including a polymer by polymerizing monomers in the presence of a polymerization solvent, and a purification process of obtaining a wet powder of a purified polymer by purifying the polymer in the polymerization reaction solution using a re-precipitation method, in which the purification process includes a process of filtering at a filtration differential pressure of 50 kPa or more, and the solid content of the wet powder of the purified polymer exceeds 40% by mass and is less than 65% by mass.

9 Claims, No Drawings

METHOD OF MANUFACTURING POLYMER FOR LITHOGRAPHY, METHOD OF MANUFACTURING RESIST COMPOSITION, AND METHOD OF MANUFACTURING SUBSTRATE HAVING PATTERN

BACKGROUND OF THE INVENTION

1. Field of the Invention

The present invention relates to a method of manufacturing a polymer for lithography, a method of manufacturing a resist composition using the polymer for lithography obtained from the above method, and a method of manufacturing a substrate having a pattern using the resist composition.

Priority is claimed on Japanese Patent Application No. 2013-166657, filed Aug. 9, 2013, the content of which is incorporated herein by reference.

2. Description of Related Art

Recently, by virtue of the advance in lithography technology, fine-fabrication of a resist pattern formed in a process of manufacturing a semiconductor device, a liquid crystal device, and the like, is increasingly proceeding. According with that, high purity of a polymer for lithography used for a lithography process is required.

A polymer for lithography is generally prepared by a method of obtaining a polymerization reaction solution including a polymer by polymerizing monomers in the presence of a polymerization solvent. In the polymerization reaction solution to be obtained, the unnecessary components such as un-reacted monomers are dissolved in a polymerization solvent in addition to a polymer. Therefore, in order to remove these components, a purification method using a re-precipitation method is known, in which the method includes precipitating the polymer by mixing the polymerization reaction solution with a poor solvent, and then solid-liquid-separating.

Patent Document 1 discloses a method of removing a poor solvent, in which since a wet powder, which is obtained by precipitating the polymers by adding a polymerization reaction solution to the poor solvent, and then, solid-liquid-separating, generally includes about 60 to 70% by weight of the poor solvent used for a precipitation operation, the wet powder is dissolved in a solvent for a resist through washing the wet powder with water, and then distilled for removing the poor solvent.

Examples in Patent Document 2 disclose a method of concentrating a wet powder, in which a liquid-containing rate in the wet powder obtained by adding a polymerization reaction solution to a poor solvent, and then performing centrifugation is about 64 to 73% by weight, and the wet powder is concentrated by a vacuum distillation after dissolving it in a glycol-based solvent.

Examples in Patent Document 3 disclose a method of performing a re-slurry process, in which a wet powder, which is obtained by adding a polymerization reaction solution to a poor solvent, and then solid-liquid-separating, is re-mixed with a poor solvent, and then solid-liquid-separated.

PATENT DOCUMENT

Patent Document 1: JP 2006-225516 A
Patent Document 2: JP 2006-199764 A
Patent Document 3: JP 2010-159393 A

SUMMARY OF THE INVENTION

However, it is not deemed that a conventional method is surely sufficient in terms of obtaining high-purity of a polymer for lithography that is required according to fine-fabrication of a resist pattern, and it is preferable that a poor solvent and monomers remained in the polymer for lithography be further reduced.

The invention is done in the light of the above reasons, and an object of the invention is to provide a method of manufacturing a polymer for lithography, in which the polymer has reduced residual amounts of the un-reacted monomers and the poor solvent used for a purification process, a method of manufacturing a resist composition using the polymer for lithography obtained by the above method, and a method of manufacturing a substrate having a pattern using the resist composition.

DETAILED DESCRIPTION OF THE INVENTION

In order to solve the above problems, the method of manufacturing a polymer for lithography of the invention includes a polymerization process of obtaining a polymerization reaction solution including a polymer by polymerizing monomers in the presence of a polymerization solvent and a purification process of obtaining a wet powder of a purified polymer by purifying the polymers in the polymerization reaction solution by using a re-precipitation method, in which the purification process includes a process of filtering at a filtration differential pressure of 50 kPa or more and the solid content of the wet powder of the purified polymer exceeds 40% by mass and is less than 65% by mass.

In addition, it is preferable that a process of dissolving the wet powder of the purified polymer in a good solvent be included, and the temperature of the wet powder be 40° C. or less until the wet powder of the purified polymer is dissolved in the good solvent.

The purification process preferably includes a re-precipitation process for obtaining a wet powder by precipitating a polymer through mixing the polymerization reaction solution with a poor solvent, and then solid-liquid-separating through a filtration.

In addition, in a rinsing process for obtaining a wet powder by contacting the wet powder after a solid-liquid separation with a rinsing solvent, and deliquoring the rinsing solvent by filtering, and a re-slurry process for obtaining a wet powder by mixing the wet powder after a solid-liquid separation or the wet powder after rinsing with a poor solvent, and then solid-liquid-separating by filtering, one or both of the processes is preferably performed one or more times to obtain the wet powder of the purified polymer.

The filtration is preferably performed under the nitrogen atmosphere.

The filtration performed under the nitrogen atmosphere is preferably a pressure filtration.

The invention provides a method of manufacturing a resist composition including a process of preparing a polymer for lithography according to the method of manufacturing a polymer for lithograph of the present invention and a process of mixing the obtained polymer for lithography and a compound that generates acid by an irradiation of active rays or radiation.

The invention provides a method of manufacturing a substrate having a pattern, including a process of preparing a resist composition according to the method of manufacturing a resist composition of the present invention, a process of forming a resist film by applying the obtained resist composition on a side to be processed of the substrate, a process of exposing light to the resist film, and a process of developing the light-exposed resist film using a developer.

According to the invention, a polymer for lithography, in which the residual monomers and residual solvent are further reduced, is obtained. The polymer for lithography is purified in a high purity, so that by preparing a resist composition using the polymer, a resist performance such as sensitivity can be improved. In addition, by manufacturing a substrate having a pattern using the resist composition, a high-precision fine resist pattern can be more stably formed.

In the present specification, a solid content of a wet powder is a value obtained by calculating the mass when 1 g of the wet powder is dried under atmospheric pressure at 150° C. for 2 hours in a solid mass.

In the present specification, a "constituent unit" means a maximum molecular chain which is formed from one monomer molecule.

In the present specification, "(meth)acrylic acid" means acrylic acid or methacrylic acid, and "(meth)acryloyloxy" means acryloyloxy or methacryloyloxy.

<Polymer for Lithography>

The polymer for lithography of the invention (hereinafter, simply also referred to as a polymer) may be not particularly limited and may be applied as long as it is a polymer used for a lithography process. Examples thereof may include a polymer for a resist used for forming a resist film, a polymer for an anti-reflection film, which is used for forming an anti-reflection film (formed on the top layer of a resist film (TARC) or an anti-reflection film formed on the bottom layer of a resist film (BARC), a gap-fill film polymer used for forming a gap-fill film, and a polymer for a top-coat film used for forming a top-coat film.

As the polymer for lithography of the present invention, a copolymer including a constituent unit having a polar group is preferable in view of adhesion of the polymer to a hydrophilic surface or affinity to a polar solvent. The constituent unit having a polar group will be described hereinafter. The constituent units other than the constituent unit having a polar group may be properly selected and included from the constituent units that are widely known for the polymers for lithograph according to the use.

Examples of a polymer for an anti-reflection film may include a copolymer including a constituent unit having an absorbent group, and a constituent unit having a reactive functional group such as an amino group, an amide group, a hydroxyl group, and an epoxy group, which are capable of being cured by reacting with a curing agent for preventing them from being mixed with a resist film. The absorbent group has high absorption performance for the light of a wavelength region, in which a photosensitive component in a resist composition has sensitivity, and specific examples thereof may include a group having a ring structure (may have any substituent) such as an anthracene ring, a naphthalene ring, a benzene ring, a quinoline ring, a quinoxaline ring, and a thiazole ring. Especially, as irradiation light in a lithography process, in the case of using a KrF laser beam, an anthracene ring, or an anthracene ring having any substituent is preferable, and in the case of using an ArF laser beam, a benzene ring, or a benzene ring having any substituent is preferable.

As a substituent in the anthracene ring, there may be a phenolic hydroxyl group, an alcoholic hydroxyl group, a carboxyl group, a carbonyl group, an ester group, an amino group, an amide group, or the like. Among them, it is preferable to have the phenolic hydroxyl group, which is protected or not protected, as an absorbent group, from the viewpoint of favorable developing ability•high resolution property. Examples of a constituent unit•monomer including the absorbent group may include benzyl(meth)acrylate, p-hydroxyphenyl(meth)acrylate, and the like.

Examples of a polymer for a gap fill film may include a copolymer including a constituent unit having a reactive functional group capable of being cured by reacting with a curing agent, in order to have an appropriate viscosity for flowing into a narrow gap and prevent from being mixed with a resist film and an anti-reflection film. Specific examples thereof may include a copolymer of hydroxyl styrene, and a monomer such as styrene, alkyl(meth)acrylate, hydroxyalkyl (meth)acrylate, and the like.

Examples of a polymer for a top coat film, which is used for a liquid immersion lithography may include a copolymer including a constituent unit having a carboxyl group, a copolymer including a constituent unit having a fluorine-containing group, in which a hydroxyl group is substituted, and the like.

A polymer for a resist includes preferably one or more of constituent units having an acid-leaving group, and more preferably a copolymer including one or more of constituent units having an acid-leaving group and one or more of constituent units having an polar group.

[Constituent Unit Having Polar Group]

"A polar group" is a functional group with polarity or a group having a group of atoms with polarity, and specific examples thereof may include a hydroxyl group, a cyano group, an alkoxy group, a carboxy group, an amino group, a carbonyl group, a group having a fluorine atom, a group having a sulfur atom, a group having a lactone skeleton, a group having an acetal structure, a group having an ether bond, and the like.

Among them, a polymer for a resist applied for a pattern-forming method including exposing under the light of a wavelength of 250 nm or less preferably includes a constituent unit having a lactone skeleton as a constituent unit having a polar group, and more preferably includes a constituent unit having the hydrophilic group to be described later.

(Constituent Unit•Monomer Having Lactone Skeleton)

As the lactone skeleton, there may be, for example, a lactone skeleton of about 4 to 20-membered rings. The lactone skeleton may be a monocycle only for a lactone ring, or a lactone ring may be condensed with an aliphatic or aromatic carbon ring or a heterocyclic ring.

In a case where a polymer includes a constituent unit having a lactone skeleton, the content thereof is preferably 20 mol % or more and more preferably 25 mol % or more in all the constituent units (100 mol %) from the viewpoint of adhesion to a substrate. In addition, from the viewpoint of sensitivity and resolution, it is preferably 60 mol % or less, more preferably 55 mol % or less, and still more preferably 50 mol % or less.

From the viewpoint of excellent adhesion to a substrate, a monomer having a lactone skeleton is preferably at least one selected from the group consisting of substituted or unsubstituted (meth)acrylic acid ester having a δ-valerolactone ring, and a substituted or unsubstituted monomer having a γ-butyrolactone ring, and an unsubstituted monomer having a γ-butyrolactone ring is particularly preferable.

Specific examples of the monomer having a lactone skeleton may include β-(meth)acryloyloxy-β-methyl-δ-valerolactone, 4,4-dimethyl-2-methylene-γ-butyrolactone, β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, (meth) acrylic acid pantoyl lactone, 5-(meth)acryloyloxy-2,6-norbornane carbolactone, 8-methacryloxy-4-oxatricyclo [5.2.1.0$^{2,6}$]decan-3-one, 9-methacryloxy-4-oxatricyclo [5.2.1.0$^{2,6}$]decan-3-one, and the like. In addition, as a monomer having a similar structure, there may be a methacryloyloxy succinic anhydride, and the like.

A monomer having a lactone skeleton may be used singly or in combination of two or more kinds thereof.
(Constituent Unit•Monomer Having Hydrophilic Group)

In the present specification, "a hydrophilic group" is at least one kind of —C(CF$_3$)$_2$—OH, a hydroxyl group, a cyano group, a methoxy group, a carboxy group, and an amino group.

Among them, a polymer for a resist applied for a pattern-forming method including exposing under the light of a wavelength of 250 nm or less preferably has a hydroxyl group or a cyano group as a hydrophilic group.

The content of the constituent units having a hydrophilic group in the polymer is preferably 5 to 30 mol % and more preferably 10 to 25 mol % in all the constituent units (100 mol %) from the viewpoint of resist pattern rectangularity.

Examples of a monomer having a hydrophilic group may include (meth)acrylic acid ester having a terminal hydroxyl group; derivatives having a substituent such as an alkyl group, a hydroxyl group, and a carboxy group on the hydrophilic group of the monomer; and things, in which a monomer (for example, (meth)acrylic acid cyclohexyl, (meth)acrylic acid 1-isobornyl, (meth)acrylic acid adamantly, (meth)acrylic acid tricyclodecanyl, (meth)acrylic acid dicyclopentyl, (meth)acrylic acid 2-methyl-2-adamantyl, (meth)acrylic acid 2-ethyl-2-adamantyl, and the like) having a cyclic hydrocarbon group has a hydrophilic group such as a hydroxyl group and a carboxy group as a substituent.

Specific examples of the monomer having a hydrophilic group may include (meth)acrylic acid, (meth)acrylic acid 2-hydroxy ethyl, (meth)acrylic acid 3-hydroxy propyl, (meth)acrylic acid 2-hydroxy-n-propyl, (meth)acrylic acid 4-hydroxybutyl, (meth)acrylic acid 3-hydroxy adamantyl, 2- or 3-cyano-5-norbonyl(meth)acrylate, 2-cyanomethyl-2-adamantyl(meth)acrylate, and the like. From the viewpoint of adhesion to a substrate, (meth)acrylic acid 3-hydroxy adamantly, (meth)acrylic acid 3,5-dihydroxy adamantly, 2- or 3-cyano-5-norbonyl(meth)acrylate, 2-cyanomethyl-2-adamantyl(meth)acrylate, and the like are preferable.

The monomer having a hydrophilic group may be used singly or in combination of two or more kinds thereof.
[Constituent Unit Having Acid-Leaving Group]

In a case where the polymer for lithography of the present invention is used as a resist use, in addition to the constituent unit having a polar group as described above, it preferably has a constituent unit having an acid-leaving group, and also, if necessary, it may further have the constituent units that are known.

"The acid-leaving group" is a group having a bond that is broken by acid, in which a part or all of the acid-leaving groups is left from a main chain of a polymer by the breaking of the bond.

In a composition for a resist, a polymer having a constituent unit having an acid-leaving group is reacted with an acidic component to dissolve in an alkaline solution and exhibits a function capable of forming a resist pattern.

A ratio of a constituent unit having an acid-leaving group is preferably 20 mol % or more and more preferably 25 mol % or more in all the constituent units (100 mol %) constituting the polymer from the viewpoint of sensitivity and resolution. In addition, from the viewpoint of adhesion to a substrate, it is preferably 60 mol % or less, more preferably 55 mol % or less, and still more preferably 50 mol % or less.

Any monomer having an acid-leaving group may be a compound having an acid-leaving group and a polymeric multiple bond, and the known monomer may be used. The polymeric multiple bond is broken at the time of a polymerization reaction to form a copolymer chain, and an ethylenic double bone is preferable.

Specific examples of a monomer having an acid-leaving group may include (meth)acrylic acid ester having an alicyclic hydrocarbon group of 6 to 20 carbon atoms and an acid-leaving group. The alicyclic hydrocarbon group may be directly bound to an oxygen atom constituting an ester bond of (meth)acrylic acid ester, and may be bound through a bonding group such as an alkylene group.

The (meth)acrylic acid ester includes (meth)acrylic acid ester having an alicyclic hydrocarbon group of 6 to 20 carbon atoms, and also having a tertiary carbon atom on a binding site with the oxygen atoms constituting an ester bond of the (meth)acrylic acid ester, or (meth)acrylic acid ester having an alicyclic hydrocarbon group of 6 to 20 carbon atoms, in which a —COOR group (R represents a tertiary hydrocarbon group, a tetrahydropranyl group, a tetrahydropyranyl group, or an oxepanyl group, which may have a substituent) is directly bound to the alicyclic hydrocarbon group or is bound to the alicyclic hydrocarbon group through a binding group.

Especially, in the case of preparing a resist composition applied for a pattern-forming method including exposing under the light of a wavelength of 250 nm or less, preferable examples of a monomer having an acid-leaving group may include 2-methyl-2-adamantyl(meth)acrylate, 2-ethyl-2-adamantyl(meth)acrylate, 1-(1'-adamantyl)-1-methylethyl (meth)acrylate, 1-methyl cyclohexyl(meth)acrylate, 1-ethyl cyclohexyl(meth)acrylate, 1-methyl cyclopentyl(meth)acrylate, 1-ethyl cyclopentyl(meth)acrylate, isopropyl adamantyl (meth)acrylate, 1-ethyl cyclooctyl(meth)acrylate, and the like.

The monomer having an acid-leaving group may be used singly or in combination of two or more kinds thereof.

<<Method of Manufacturing Polymer for Lithography>>

A method of manufacturing a polymer for lithography of the present invention includes a polymerization process for obtaining a polymerization reaction solution including a polymer by polymerizing monomers corresponding to constituent units to be obtained in the presence of a polymerization solvent, a purification process for obtaining a wet powder of a purified polymer by purifying the polymer in the polymerization reaction solution using a re-precipitation method, a process for drying the wet powder of the purified polymer, or a commercialization process for manufacturing a polymer for lithography in a dried powder state or a solution state through a process of dissolving the wet powder of the purified polymer in a good solvent.

<Polymerization Process>

As a polymerization method, a solution polymerization method is used. In other words, monomers are polymerized in the presence of a polymerization solvent to obtain a polymerization reaction solution. The solution polymerization method may be performed by using a known method.

Preferably, the monomers are radical-polymerized using a polymerization initiator in the presence of the polymerization solvent to obtain a polymerization reaction solution. The supply of the monomers and polymerization initiator to a polymerization vessel may be a continuous supply and may be a dropping supply. From the viewpoint that the gaps of the average molecular weights and molecular weight distributions, which are caused by the difference in the preparation lots, are small and the polymers are simply obtained with reproducibility, it is preferable to use a dropping polymerization method dropping the monomers and polymerization initiator into a polymerization vessel.

According to the dropping polymerization method, a polymerization vessel is heated to a predetermined polymerization temperature, and then the monomers and polymerization initiator are each independently dropped or dropped in any combination thereof into the polymerization vessel.

For the monomers, only the monomers may be dropped, or the monomers may be dissolved in a polymerization solvent and then may be dropped in a monomer solution.

The polymerization solvent and/or monomers may be added to a polymerization vessel in advance.

The polymerization initiator may be directly dissolved in a monomer, may be dissolved in a monomer solution, or may be dissolved only in a polymerization solvent.

The monomers and polymerization initiator may be mixed in the same storage tank, and then dropped into the polymerization vessel; may be dropped from separate independent storage tanks into the polymerization vessel; or just before supplying the monomers and polymerization initiator from separate independent storage tanks into the polymerization vessel, the monomers and polymerization initiator may be mixed and then may be dropped into the polymerization vessel.

For the monomers and polymerization initiator, one of them may be dropped and then the other may be dropped, or both of them may be dropped in the same timing A dropping rate may be constant until a dropping end, or may be changed in multiple stages according to the copolymerization reactivity of the monomers and the consumption coefficient of the monomers or polymerization initiator.

The dropping may be continuously performed or may be intermittently performed.

A polymerization temperature is preferably 50 to 150° C.

After performing the polymerization reaction at a predetermined polymerization temperature for a predetermined time, the polymerization reaction is stopped to obtain the polymerization reaction solution. As a means for stopping the polymerization reaction, a process for cooling a reaction solution is generally used, but the polymerization reaction may be stopped by adding a radical scavenger.

Examples of the polymerization solvent are as follows:

Ethers: chain ether (diethyl ether, propylene glycol monomethyl ether, and the like), cyclic ether (tetrahydrofuran (hereinafter, referred to as "THF"), 1,4-dioxane, and the like), and the like.

Esters: methyl acetate, ethyl acetate, butyl acetate, ethyl lactate, butyl lactate, propylene glycol monomethyl ether acetate (hereinafter, referred to as "PGMEA"), γ-butyrolactone, and the like.

Ketones: acetone, methylethyl ketone (hereinafter, referred to as "MEK"), methyl isobutyl ketone (hereinafter, referred to as "MIBK"), cyclohexanone, and the like.

Amides: N,N-dimethyl acetamide, N,N-dimethylfomamide, and the like.

Sulfoxides: Dimethyl sulfoxide, and the like.

Aromatic hydrocarbon: benzene, toluene, xylene, and the like.

Aliphatic hydrocarbon: hexane, and the like.

Alicyclic hydrocarbon: cyclohexane, and the like.

The polymerization solvents may be used singly or in combination of two or more kinds thereof.

A polymerization initiator preferably generates radicals effectively by heat. Examples thereof may include an azo compound (2,2'-azobisisobutyronitrile, dimethyl-2,2'-azobisisobutyrate, 2,2'-azobis[2-(2-imidazolin-2-yl)propane], and the like), organic peroxide (2,5-dimethyl-2,5-bis(tert-butylperoxy)hexane, di(4-tert-butylcyclohexyl)peroxy dicarbonate, and the like), and the like, <Purification Process>

A purification process is a process for obtaining a wet powder of a purified polymer by purifying the polymer in the polymerization reaction solution obtained in the polymerization process using a re-precipitation method. The re-precipitation method is a method for obtaining precipitate as a wet powder by precipitating the polymer by mixing a poor solvent for the polymer and a polymerization reaction solution, and then performing a solid-liquid separation. Such a method is effective to remove un-reacted monomers and polymerization initiator along with a polymerization solvent in the polymerization reaction solution. In a case where un-reacted monomers remain in the wet powder of the purified polymer, since the sensitivity of a resist composition prepared using the wet powder described above is easily decreased, the un-reacted monomers are preferably removed as much as possible.

A purification process at least includes a re-precipitation process for obtaining a wet powder by precipitating the polymer for lithography through mixing the polymerization reaction solution and poor solvent, and then performing a solid-liquid separation.

In addition, among a rinsing process for obtaining a wet powder by contacting the wet powder after a solid-liquid separation with a rinsing solvent, and deliquoring the rinsing solvent, and a re-slurry process for obtaining a wet powder by mixing the wet powder after a solid-liquid separation or the wet powder after rinsing with a poor solvent for a polymer, and then solid-liquid-separating, it is preferable that one or both of the processes be performed one or more times.

For the invention, the solid content of the wet powder of the purified polymer obtained in the purification process exceeds 40% by mass. In detail, the solvent is removed so as for the solid content of the wet powder of the purified polymer obtained in the process that is finally performed among a re-precipitation process, a rinsing process, and/or a re-slurry process that are performed in the purification process to be more than 40% by mass.

In other words, in a case where a re-precipitation process is only performed as a purification process, the process is performed so that the solid content of the wet powder of the polymer obtained in the re-precipitation process exceeds 40% by mass. In a case where a rinsing process is the final process in the purification process, the solid content of the wet powder after the rinsing process is to be more than 40% by mass. In a case where a re-slurry process is the final process in the purification process, the solid content of the wet powder obtained in the re-slurry process is to be more than 40% by mass.

By removing the solvent so as for the solid content of the wet powder of the purified polymer to be more than 40% by mass, the impurities such as un-reacted monomers, polymerization initiator, or polymerization solvent, which is remained in the wet powder, can be sufficiently reduced.

The solid content of the wet powder of the purified polymer is preferably 45% by mass or more, and more preferably 50% by mass or more. The upper limit of the solid content of the wet powder is less than 65% by mass. In the case of being 65% by mass or more, the process time becomes too long and productivity is damaged.

For a part or whole of the processes other than the process that is finally performed in the purification process, the solid contents of the wet powders obtained in the corresponding processes preferably exceed 40% by mass, more preferably 45% by mass or more, and still more preferably 50% by mass or more. The upper limit of the solid content of the wet powder is, but is not particularly limited, preferably 90% by mass or less, more preferably 80% by mass or less, still more preferably 70% by mass or less, and most preferably less than 65% by mass, by reason that a process time does not become too long.

In the invention, the purification process includes a process for filtering at a filtration differential pressure of 50 kPa or more. In other words, at least a part of deliquoring and solid-liquid separation performed in the purification process is performed in a method of filtering at a filtration differential pressure of 50 kPa or more.

It is preferable that among a solid-liquid separation in the re-precipitation process, a deliquoring in the rinsing process, and a solid-liquid separation in the re-slurry process, the solid-liquid separation or deliquoring that is finally performed at least be performed in a method of filtering at a filtration differential pressure of 50 kPa or more.

The solid-liquid separation or deliquoring other than the solid-liquid separation or deliquoring that is finally performed is also preferably performed in a method of filtering at a filtration differential pressure of 50 kPa or more. The whole of the solid-liquid separation or deliquoring performed in the purification process is more preferably performed in a method of filtering at a filtration differential pressure of 50 kPa or more.

At least a part or preferably the whole of the filtering performed in the purification process is preferably performed under a nitrogen atmosphere. In detail, the filtering is preferably performed while a cake in a filter comes in contact with a nitrogen gas.

As a method of filtering under a nitrogen atmosphere, a pressure filtration is preferable. In detail, a pressure filtration is preferably performed using nitrogen gas as a pressure medium.

[Re-Precipitation Process]

In a re-precipitation process, first, the polymerization reaction solution obtained in the polymerization process is mixed with a poor solvent to precipitate a polymer to be obtained.

A poor solvent has small ability for dissolving a polymer for lithography, and thus, is a solvent capable of precipitating the polymer. A known poor solvent may be properly selected according to a composition of a polymer, and then, is used. From the viewpoint that un-reacted monomer, polymerization initiator, and the like used for synthesizing a polymer for lithography can be efficiently removed, preferable examples of the poor solvent may include methanol, isopropyl alcohol, diisopropyl ether, heptanes, or water. The poor solvent may be used singly or in combination of two or more kinds thereof. In the case of using the mixture of two or more solvents as a poor solvent, the mixture may be used as long as being a poor solvent for a polymer, and the mixture may include a good solvent dissolving a polymer.

When the polymerization reaction solution is mixed with a poor solvent in the re-precipitation process, the polymerization reaction solution is preferably dropped into the poor solvent to precipitate the polymer in the polymerization reaction solution. The used amount of the poor solvent is, but is not particularly limited, preferably the same mass or more as the polymerization reaction solution because un-reacted monomers are easily reduced, and preferably 3 times or more, more preferably 4 times or more, still more preferably 5 times or more, and most preferably 6 times or more, with respect to a mass standard. The upper limit thereof is not particularly limited, but operation efficiency in the later filtration process is deteriorated when the amount is too much. For example, 10 times or less is preferable with respect to a mass standard.

Before the polymerization reaction solution is mixed with the poor solvent, if necessary, the polymerization reaction solution may be diluted with a dilute solvent to be a proper solution viscosity. Examples of the dilute solvent may include 1,4-dioxane, acetone, THF, MEK, MIBK, γ-butyrolactone, PGMEA, PGME, ethyl lactate, ethyl acetate, and the like. The dilute solvents may be used singly or in combination of two or more kinds thereof.

In the case of diluting, after diluting, the difference between a solubility parameter (hereinafter, also referred to as "a SP value") of a solvent (a mixture of a polymerization solvent and a dilute solvent) in the polymerization reaction solution and a SP value of a poor solvent used for a re-precipitation is preferably small, by reason that the favorable dispersibility of a polymer can be obtained and the monomers can be efficiently removed.

The SP value of the solvent can be obtained, for example, by the method disclosed in "Polymer Handbook", fourth edition, pages VII-675 to VII-711, and in detail, disclosed in Table 1 (page VII-683) and Tables 7 and 8 (pages VII-688 to VII-711). In addition, the SP value of the mixed solvent of a plurality of solvents may be obtained by a known method. For example, the SP value of the mixed solvent may be obtained by the sum of multiplications of the SP value and volume fraction of each of the solvents, since an additive property is established.

In the re-precipitation process, the polymer can be obtained in the state of a wet powder by performing the solid-liquid separation of the precipitate precipitated in the poor solvent. The operation of the solid-liquid separation may be performed by a known method using a solid-liquid separator, such as a pressure filter, a decompressed filter, a nature filter, and a centrifugal separator.

As a method for increasing the solid content of wet powder obtained in the re-precipitation process, there may be preferably a method of adjusting an operation condition such as pressure, centrifugal force, and an operation time so as to increase an amount of deliquoring through solid-liquid-separating using a pressure filter, a decompressed filter, or a centrifugal separator.

For example, in the case of using a centrifugal separator, centrifugal force applied to the polymer is strengthened, in the case of using a decompressed filter, a decompression degree of absorption is raised, and in the case of using a pressure filter, the pressure of the pressurization is increased, and thereby the amount of the deliquoring can be increased.

Particularly, it is preferable to use a pressure filter by reason that the differential pressure of atmospheric pressure or more can be obtained. The filtration differential pressure of the pressure filter is preferably 50 kPa or more, more preferably 100 kPa or more, and still more preferably 150 kPa or more. The upper limit of the filtration differential pressure of the pressure filter may be within the range that the wet powder is not agglomerated, and then can be subjected into the process. For example, the upper limit is preferably 500 kPa or less, and more preferably 400 kPa or less.

At the time of filtering, a filter material may be a filter paper, a filter cloth, a ceramic filter, a glass fiber filter, a membrane filter, and the like. A filter cloth can endure the differential pressure at the time of filtering, and has excellent handling property, and thus, it is preferable to use the filter cloth.

In addition, the amount of deliquoring can be increased by increasing the time of solid-liquid separation operation. In the case of using a pressure filter or a decompressed filter, a solvent consistently flows out from a cake in the filter for a certain period of time immediately after initiating the operation. Even after the solvent does not consistently flow out, while a pressurization or decompressing state is maintained, the time of solid-liquid separation operation is increased, and thereby gas is passed through the cake, and thus, the solvent remained in the wet powder can be efficiently removed.

The time of solid-liquid separation operation lasts preferably for 10 minutes or more, more preferably for 20 minutes or more, still more preferably for 40 minutes or more, and most preferably for 60 minutes or more from the start of the operation. The upper limit thereof is not particularly limited, but preferably less than 5 hours from the viewpoint of preventing that the time for the operation becomes excessively long.

In addition, during the process of the solid-liquid separation, it is preferable that the gas passed through the filter be passed through the wet powder cake because the high purity polymer is easily obtained. As the gas, in terms of a decomposition of a polymer or securement of safety, it is preferable to use an inert gas, and it is more preferable to use nitrogen. Particularly, it is preferable to use the nitrogen, in which the solid-liquid separation is performed by using a pressure filter, and the nitrogen is passed through the filter, as a pressure medium, because the high purity polymer can be easily obtained.

[Rinsing Process]

In the rinsing process, the wet powder after being subjected to the solid-liquid separation comes in contact with a rinsing solvent, and thereby, the rinsing solvent is subjected to the deliquoring to obtain a wet powder. The wet powder after being subjected to the solid-liquid separation in the re-precipitation process may be subjected to the rinsing process, and also the wet powder after being subjected to the solid-liquid separation in the re-slurry process may be subjected to the rinsing process. In addition, all of them may be subjected to the rinsing process.

As the rinsing solvent, the same poor solvent as the poor solvent that can be used in the re-precipitation process can be used. It is preferable to select the solvent capable of being uniformly mixed with a polymerization solvent by dissolving the monomers used in the polymerization process. From the viewpoint that there are not many types of a poor solvent used in the purification process, and the management of the residual solvent is easy, it is preferable to use the poor solvent composed of the same kinds of the solvents as the poor solvent used in the re-precipitation process. In addition, from the viewpoint of the production efficiency, it is more preferable to use the same poor solvent as the poor solvent used in the re-precipitation process.

The rinsing solvent is preferably supplied to a wet powder at a plurality of points such as 2 points or more. By reason that the rinsing solvent can be uniformly supplied to the wet powder and an effect on removing the impurities of the wet powder can be favorably obtained, the rinsing solvent is supplied preferably at 3 points or more, more preferably 5 points or more, still more preferably 10 points or more, and most preferably 20 points or more. The supply of the rinsing solvent from the plural points may be performed by using a plurality of nozzles or a shower nozzle. By reason that it is easy to make the size of drop particle of the rinsing solvent be small and supply uniformly the rinsing solvent, a nozzle diameter is preferably 15 mm φ or less. In addition, it is also preferable to use a shower nozzle. The average diameter of the drop diameter of the rinsing solvent is preferably 10 mm or less, more preferably 5 mm or less, and still more preferably 1 mm or less.

In the case of preparing a plurality of lots with the same conditions, by reason that it is easy to obtain favorable reproductivity between the lots, it is preferable that the rinsing solvent that comes in contact with the wet powder be maintained at 50° C. or less.

The maintenance of the rinsing solvent at 50° C. or less means that the temperature is controlled such that the temperature of the rinsing solvent immediately before coming in contact with the wet powder is maintained at a predetermined temperature, that is, around t° C. (t≤50). In detail, it means that the temperature of the rinsing solvent is stored at t−5° C. or more and t+5° C. or less (t is the freezing point of the rinsing solvent or more and 50° C. or less). When t is 50° C. or less, even if the glass transition point of a polymer is low, it is easy to prevent the bonding of the wet powder. t is preferably 40° C. or less and more preferably 30° C. or less. The lower limit of t is the freezing point of the rinsing solvent or higher, and by reason that the load to a production device is low, t is preferably 0° C. or higher.

The used amount of the rinsing solvent is not particularly limited, and may be adjusted according to the amount of the residual monomers and the amount of the residual solvent in the wet powder to be subjected to the rinsing, but by reason that the process time does not become too long, as a mass ratio with respect to the polymerization reaction solution to be obtained in the polymerization process, the same amount or less is preferable.

The rinsing treatment may be performed in the solid-liquid separator used for a solid-liquid separation in the previous processes of the rinsing process, or the wet powder taken out of the solid-liquid separator may be subjected to the rinsing treatment. By reason that it is easy to maintain high productivity and prevent the contamination by the impurities, it is preferable that the wet powder subjected to the solid-liquid separation come in contact with the rinsing solvent in the state of being inside the solid-liquid separator, and thus, the rinsing treatment is performed. In other words, the wet powder subjected to the solid-liquid separation comes in contact with the rinsing solvent in the solid-liquid separator that performs the solid-liquid separation without being moved, and thus, the rinsing treatment is preferable performed.

When the rinsing process is finally performed in the purification process in the invention, the deliquoring of the rinsing solvent is performed such that the solid content of the wet powder after rinsing exceeds 40% by mass. As a method for increasing the solid content of the wet powder, there may be preferably a method of performing the deliquoring of the rinsing solvent using a pressure filter, a decompressed filter, or a centrifugal separator and a method of adjusting an operation condition such as pressure, centrifugal force, and an operation time so as to increase an amount of deliquoring through the method as described in the re-precipitation process.

It is preferable to perform the rinsing process with the solid content of the wet powder of more than 40% by mass, in which the wet powder is to be subjected to the rinsing treatment. In other words, it is preferable that the solid content of the wet powder that comes in contact with a poor solvent in the rinsing process exceed 40% by mass.

In a case where the wet powder obtained in the re-precipitation process is subjected to the rinsing treatment, it is preferable that the solid-liquid separation be performed such that the solid content of the wet powder that can be obtained at the time of performing the solid-liquid separation in the re-precipitation process is to be x % by mass (x>40).

In a case where the wet powder obtained in the re-slurry process is subjected to the rinsing treatment, it is preferable that the solid-liquid separation be performed such that the solid content of the wet powder that can be obtained at the time of performing the solid-liquid separation in the re-slurry process is to be x % by mass (x>40). As a method for increasing the solid content of the wet powder obtained in the re-slurry process, there may be the same method as the method for increasing the solid content of the wet powder obtained in the re-precipitation process.

When the solid content of the wet powder at the time of initiating the rinsing process exceeds 40% by mass, the solvent included in the wet powder is small in quantity, and thus, it is easy to sufficiently obtain an effect on reducing the un-reacted monomers and solvent remained in the wet powder by the contact with the rinsing solvent.

The solid content at the time of initiating the rinsing process is preferably 45% by mass or more, and more preferably 50% by mass or more. The upper limit of the solid content of the wet powder at the time of initiating the rinsing process is not particularly limited, but by reason that the process time does not become too long, it is preferably 90% by mass or less, more preferably 80% by mass or less, still more preferably 70% by mass or less, and most preferably less than 65% by mass.

[Re-Slurry Process]

In the re-slurry process, the wet powder after being subjected to the solid-liquid separation or the wet powder after being subjected to the rinsing is again mixed with a poor solvent, and then the mixture thus obtained is subjected to the solid-liquid separation to obtain the wet powder. Such a process is an effective purification method to further reduce the impurities such as un-reacted monomers and polymerization initiator remained in the wet powder.

The re-slurry process may be performed with the wet powder after being subjected to the solid-liquid separation in the re-precipitation process, or the re-slurry process may be repeated with the wet powder after being subjected to the solid-liquid separation in the re-slurry process.

In addition, the wet powder after being subjected to the solid-liquid separation in the re-precipitation process or re-slurry process may be subjected to the rinsing process before being subjected to the re-slurry process. In other words, the re-slurry process may be performed with the wet powder after being subjected to the rinsing.

In order to further reduce the impurities in the purification process, the re-slurry process may be performed preferably two times or more, and more preferably three times or more. By reason that the process time does not become too long, the number of the re-slurry processes in the purification process is preferably 6 times or less and more preferably 5 times or less.

The poor solvent used for the re-slurry process may be the same as the poor solvent capable of being used for the re-precipitation process. From the viewpoint that there are not many types of a poor solvent used in the purification process, and the management of the residual solvent is easy, it is preferable to use the poor solvent composed of the same kinds of the solvents as the poor solvent used in the re-precipitation process. In addition, when the poor solvent having a different SP value is used in the re-slurry process, the poor solvent used in the re-precipitation process can allow the impurities that are the kinds different than the impurities that are easily removed in the re-precipitation process to be easily removed in the re-slurry process, and the impurities present in the polymerization reaction solution is efficiently and easily decreased, and thus, it is preferable.

The method of the solid-liquid separation in the re-slurry process may be the same method as the solid-liquid separation in the re-precipitation process.

In a case where the re-slurry process is finally performed in the purification process of the invention, the solid-liquid separation is performed such that the solid content of the wet powder obtained in the re-slurry process exceeds 40% by mass. As a method for increasing the solid content of the wet powder, there may be preferably a method of performing the solid-liquid separation using a pressure filter, a decompressed filter, or a centrifugal separator and a method of adjusting an operation condition such as pressure, centrifugal force, and an operation time so as to increase an amount of deliquoring through the same method as described in the re-precipitation process.

It is preferable that the solid content of the wet powder mixed with the poor solvent in the re-slurry process exceed 40% by mass. In other words, in the case of performing the re-slurry process with the wet powder obtained by the solid-liquid separation in the re-precipitation process or re-slurry process, the solid-liquid separation is performed such that the solid content of the wet powder is to be x % by mass (x>40) and the wet powder having the solid content of x % by mass is mixed with the poor solvent in the re-slurry process. In a case where the wet powder obtained by the deliquoring of the rinsing solvent in the rinsing process is subjected to the re-slurry process, the rinsing solvent is subjected to the deliquoring such that the solid content of the wet powder is to be x % by mass (x>40), and the wet powder having the solid content of x % by mass is mixed with the poor solvent in the re-slurry process.

As described above, when the solid content of the wet powder supplied in the re-slurry process exceeds 40% by mass, the solvent included in the wet powder is small in quantity, and thus, it is easy to sufficiently obtain an effect on decreasing un-reacted monomers and solvent remained in the wet powder in the re-slurry process.

The solid content (x % by mass) of the wet powder supplied in the re-slurry process is preferably 45% by mass or more, and more preferably 50% by mass or more. The upper limit of the solid content (x % by mass) of the wet powder supplied in the re-slurry process is not particularly limited, but by reason that the process time does not become too long, it is preferably 90% by mass or less, more preferably 80% by mass or less, still more preferably 70% by mass or less, and most preferably less than 65% by mass.

<Commercialization Process>

In the commercialization process, a polymer for lithography in a dried powder state or solution state is prepared through a process (a drying process) of drying the wet powder of the purified polymer obtained in the purification process or a process (a dissolving process) of dissolving the wet powder of the purified polymer obtained in the purification process in a good solvent.

A polymer for lithography in a solution state may be prepared by drying the wet powder of the purified polymer and then dissolving the obtained wet powder in a good solvent.

A polymer for lithography in a concentrated solution state (a concentrated liquid state) may be prepared by dissolving the wet powder of the purified polymer in a good solvent and then concentrating the dissolved wet powder (a concentration process).

[Drying Process]

In the drying process, a polymer for lithography in a dried powder state is obtained by drying the wet powder obtained in the purification process.

The drying method may be a method capable of drying the wet powder obtained in the purification process to be a desired solid content, and a known drying method may be used. By reason that it is easy to dry the wet powder for a more short period of time, there may be preferably a decompression drying method including decompressing under a drying atmosphere, a heating drying method including heating under a drying atmosphere, or a decompression and heating drying method including decompressing and heating under a drying atmosphere, and especially, the decompressed and heating drying method is preferable. In the present specification, the expression "under a drying atmosphere" means the state where the volatile components attached to the polymer volatilize.

The degree of decompression in the case of decompressing is preferably 50 kPa or less, more preferably 40 kPa or less, and still more preferably 30 kPa or less. The lower limit of the degree of decompression is not particularly limited, but practically, 0.01 kPa or more.

The heating temperature in the case of heating is preferably 30° C. or higher, more preferably 35° C. or higher, and still more preferably 40° C. or higher. The upper limit of the heating temperature is preferably 100° C. or lower, more preferably 90° C. or lower, and still more preferably 80° C. or lower, from the viewpoint of preventing a heat deterioration of the polymer.

In a case where a polymer for lithography in a solution state is prepared by drying the wet powder of the purified polymer and then dissolving it in a good solvent, the solid content after the drying process is preferably 65% by mass or more, and more preferably 75% by mass. When the solid content is 65% by mass or more, it is easy to obtain a favorable solubility in a solvent. As the solid content is higher, the drying time becomes long. From the viewpoint of the production efficiency, the solid concentration is preferably 90% by mass or less.

In addition, in the case of preparing a polymer for lithography in a dried powder state as a product type, the solid content after the drying process is preferably 90 to 100% by mass, and more preferably 95 to 100% by mass. When it is 90% by mass or more, it is easy to favorably obtain desired lithography performance because the amount of the purification solvent included in the lithography composition becomes low. The upper limit of the solid content is preferably 99.9% by mass or less by reason that the drying time does not become too long.

[Dissolving Process]

In the dissolving process, the wet powder of the purified polymer or the dried matter of the wet powder of the purified polymer is dissolved in a good solvent. For this reason, the solution prepared by dissolving the polymer for lithography in the good solvent is obtained.

As a good solvent, a known solvent capable of dissolving a polymer may be used, and the solvents that are selected as a polymerization solvent as described above may be used. In the case of using a polymer for preparing a resist composition, it is preferable to use, as a good solvent, the same solvent as the resist solvent for the resist composition in the dissolving process.

It is preferable to dissolve the wet powder of the purified polymer or the dried matter of the wet powder of the purified polymer in a good solvent at room temperature in the dissolving process.

In the present specification, the dissolution in a good solvent at room temperature means that the wet powder or the dried matter thereof is dissolved in a good solvent that reaches constant temperature at a predetermined temperature (atmosphere temperature) without active cooling or heating. The room temperature (atmosphere temperature) is in the range of 0 to 40° C. and preferably 16 to 30° C.

The temperature immediately before mixing the wet powder or dried matter thereof to be dissolved in a good solvent with a good solvent is preferably a constant temperature at the predetermined temperature (atmosphere temperature). In other words, as the absolute value of the temperature difference between the wet powder or the dried matter thereof and a good solvent, to be mixed, the lower value is preferable by reason that the active cooling or heating is not required. In detail, the absolute value of the temperature difference is preferably 20° C. or less and more preferably 15° C. or less.

In addition, when the wet powder or dried matter is dissolved in a good solvent, additives such as a storage stabilizer may be properly added. In other words, the polymer solution for lithography obtained as a final product may include additives such as a storage stabilizer.

In the invention, it is preferable to prepare a polymer for lithography in a solution state through a process (a dissolving process) of dissolving the wet powder of the purified polymer obtained in the purification process in a good solvent.

The one prepared by dissolving the wet powder of the purified polymer in a good solvent may become a final product, or the polymer for lithography in a solution state (a concentrated liquid state), which is concentrated after dissolving the wet powder of the purified polymer in a good solvent and then concentrating the wet powder thus obtained (a concentration process), may become a final product.

The upper limit of the solid content of the wet powder of the purified polymer to be dissolved in a good solvent is less than 65% by mass. It is preferable to dissolve the wet powder of the purified polymer in a good solvent without being dried.

The temperature of the wet powder is preferably 40° C. or less until the wet powder of the purified polymer is dissolved in a good solvent. It is more preferable to dissolve the wet powder of the purified polymer in a good solvent at the room temperature.

[Concentration Process]

A concentrated solution prepared by concentrating the solution obtained in the dissolving process, in which the concentrated solution includes the polymer for lithography dissolved in a good solvent, may be prepared. By concentrating, it is possible to remove the residual compound having a low boiling point.

The concentration process may be performed by using a known concentration method. By reason that the concentration can be performed in a short period of time, a decompressed concentration is preferable. In the case of performing the decompressed concentration, the degree of the decompression is preferably 50 kPa or less, more preferably 40 kPa or less, and still more preferably 30 kPa or less. The lower limit of the degree of the decompression is not particularly limited, but practically, 0.05 kPa or more.

In addition, it is preferable that the heating be performed during the decompressed concentration by reason that the concentration can be performed for a short period of time. The heating temperature is preferably 20° C. or higher, more preferably 30° C. or higher, and still more preferably 40° C. or higher. In addition, from the viewpoint of preventing the heating deterioration of the polymer, the heating temperature is preferably 100° C. or lower, more preferably 90° C. or lower, and still more preferably 80° C. or lower.

It is preferable to continuously stir during the concentration from the viewpoint of preventing the bumping. In addition, by reason that it is possible to control pressure and thermal conductivity is excellent, and thereby it is easy to control the reaction temperature, the concentration is preferably performed in a metal reaction vessel made by a pressure-resistant material. As a metal, a stainless steel (hereinafter, also referred to as "SUS") is preferable because it has high corrosion resistance and can reduce the inclusion of metal impurities into the polymer.

[Filtration Process]

If necessary, the solution obtained in the dissolving process or the concentrated solution obtained in the concentration process may be filtered. Therefore, the polymer solution having reduced gel substances or foreign substances in the polymer may be obtained.

In the case of performing the concentration process, it is preferable to filter the solution obtained in the dissolving process before the concentration process from the view point of performing the filtration for a short period of time in a state of suppressing the pressure loss in a low degree before and after the filtration filter. By reason that the polymer gel substances or foreign substances that are concerned to be mixed into a final product can be efficiently reduced, it is preferable to filter the concentrated solution obtained after the concentration process. Both the solution obtained in the dissolving process and the concentrated solution may be filtered. In other words, the solution obtained in the dissolving process is filtered, the filtrate thus obtained is supplied to the concentration process, and then the concentrated solution thus obtained may be again filtered.

<<Method for Manufacturing Resist Composition>>

The method for manufacturing the resist composition of the present invention includes a process of preparing a polymer for lithography according to the manufacturing method of the present invention and a process of mixing the polymer for lithograph thus obtained, and the compound that generates acid by the irradiation of active rays or radiation. If necessary, the resist solvent is again added and then mixed. As the resist solvent, the solvents that are selected as the polymerization solvent described above may be used.

A polymer (a resist polymer) including a constituent unit having an acid-leaving group is used as a polymer for lithography, and the compound that generates acid (hereinafter, referred to as "a photo acid generator") by the irradiation of active rays or radiation is included in the resist composition, thereby obtaining "a resist composition".

The polymer for lithograph used for manufacturing the resist composition may be a polymer in a dried powder state obtained or a solution state in the commercialization process. The polymer in a solution state may be a solution obtained in the dissolving process, a filtrate filtered thereafter, a concentrated solution obtained in the concentration process, and a filtrate filtered thereafter.

[Compound that Generates Acid by Irradiation of Active Rays or Radiation]

The compound (photo acid generator) that generates acid by the irradiation of active rays or radiation may be arbitrarily selected from a known compound capable of being used as a photo acid generator of the resist composition. The photo acid generators may be used singly or in combination of two or more kinds thereof.

Examples of the photo acid generator may include an onium salt compound, a sulfone imide compound, a sulfone compound, a sulfonate ester compound, a quinonediazide compound, a diazo methane compound, and the like.

The used amount of the photo acid generator is preferably 0.1 to 20 parts by mass and more preferably 0.5 to 10 parts by mass with respect to 100 parts by mass of the polymer.

[Nitrogen-Containing Compound]

The resist composition may include a nitrogen-containing compound. By including the nitrogen-containing compound, the shape of a resist pattern, the post exposure stability of the latent image, and the like are further improved. In other words, the sectional shape of the resist pattern becomes more close to a rectangle, and although a semiconductor device may be left for several hours after irradiating light to the resist film and then baking (PEB) to the next developing treatment as a mass production line of the semiconductor devices, in the case of having the leaving time (elapsed time), the deterioration generation of the sectional shape of the resist pattern is suppressed.

The nitrogen-containing compound is preferably amine, and more preferably, secondary lower aliphatic amine, and tertiary lower aliphatic amine.

The amount of the nitrogen-containing compound is more preferably 0.01 to 2 parts by mass with respect to 100 parts by mass of the polymer.

[Organic Carboxylic Acid, Phosphorus Oxoacid or Derivatives Thereof]

The resist composition may include organic carboxylic acid, phosphorus oxoacid, and the derivatives thereof (hereinafter, collectively referred to as "acid compounds"). By including the acid compounds, it is possible to suppress the deterioration of sensitivity according the combination of the nitrogen-containing compound and also to further improve the shape of the resist pattern, the post exposure stability of the latent image, and the like.

As the organic carboxylic acid, there may be malonic acid, citric acid, malic acid, succinic acid, benzoic acid, salicyclic acid, and the like.

As the phosphorus oxoacid or the derivatives thereof, there may be phosphoric acid or the derivatives thereof, phosphonic acid or the derivatives thereof, phosphinic acid or the derivatives thereof, and the like.

The amount of the acid compound is preferably 0.01 to 5 parts by mass with respect to 100 parts by mass of the polymer.

[Additives]

If necessary, the resist composition may include, as a component in addition to the components mentioned above, various additives such as a surfactant, other quenchers, a sensitizer, a halation inhibitor, a storage stabilizer, and an antifoaming agent. As the additives, all of the additives that are known in the prior art may be used. In addition, the amount of the additives is not particularly limited, but may be properly determined.

<Method of Manufacturing Substrate Having Fine Pattern>

The method of manufacturing a substrate having a fine pattern of the invention may be performed by using the known method. Examples thereof will be described.

First, the resist composition obtained from the manufacturing method of the present invention is applied on a surface of a substrate to be processed, such as, a silicon wafer to be formed with a desired fine pattern, by using a spin coating. And then, the substrate to be processed, which is applied with the resist composition, is subjected to a baking treatment (a pre-baking) for drying to form a resist film on the substrate.

Subsequently, the light of a wavelength of 250 nm or less is irradiated to the resist film through a photomask to form a latent image (light exposure). As the irradiation light, there may be preferably KrF eximer laser, ArF eximer laser, $F_2$ excimer laser, and EUV light source, and may be particularly preferably ArF eximer laser. In addition, the electron beam may be irradiated.

In addition, an immersion-type exposure may be performed, in which the light is irradiated in the state of intervening the liquid having a high refractive index, such as pure water, perfluoro-2-butyl tetrahydrofuran, and perfluoro trialkylamine between the resist film and the final lens of an exposure device.

By performing a proper heating treatment after the light exposure (baking after the light exposure, PEB) and contacting the resist film with an alkali developer, the part of the light exposure is dissolved in the developer to be removed (developing). As the alkali developer, the known developer may be used.

After developing, the substrate is properly rinsed with pure water. In this way, a resist pattern is formed on the substrate to be processed.

A suitable heating treatment (post baking) is performed to the substrate having the resist pattern to strengthen a resist, and the part without the resist is selectively etched.

After etching, by removing the resist with a releasing agent, the substrate having a fine pattern is obtained.

EXAMPLES

Hereinafter, the present invention will be described in detail with reference to Examples, but the invention is not limited thereto. In addition, in each of Examples and Comparative Examples, "part" means "part by mass" unless otherwise particularly indicated. As a measuring method and evaluation method, the following methods are used.

<Measurement of Weight Average Molecular Weight>

A weight average molecular weight (Mw) and molecular weight distribution (Mw/Mn) of a polymer were obtained by a polystyrene conversion through a gel permeation chromatography under the following condition (GPC condition).

[GPC Condition]

Apparatus: Tosoh High-speed GPC apparatus, HLC-8220GPC (Trade Name), manufactured by Tosoh Corporation Separation column: Shodex GPC K-805L (Trade Name), in which three ones are connected in series, manufactured by Showa Denko K.K.

Measurement temperature: 40° C.

Eluent: Tetrahydrofuran (THF)

Sample: Solution prepared by dissolving about 20 mg of a polymer in 5 mL of THF, and then filtering the obtained polymer solution with 0.5 μm membrane filter Flow rate: 1 mL/min.

Injection amount: 0.1 mL

Detector: Differential refractometer

Calibration curve I: the relationship between an elution time and a molecular weight was obtained by injecting the solution prepared by dissolving about 20 mg of standard polystyrene in 5 mL of THF and then filtering the solution thus obtained with 0.5 μm membrane filter to a separation column under the above-described conditions. As the standard polystyrene, the following standard polystyrenes (all of them are trade names) manufactured by Tosoh Corporation were used.

F-80 (Mw=706,000)
F-20 (Mw=190,000)
F-4 (Mw=37,900)
F-1 (Mw=10,200)
A-2500 (Mw=2,630)
A-500 (compounds of Mw=682,578,474,370,260)

<Measurement of Solid Content of Wet Powder>

As the solid content of the wet powder, the mass prepared by drying 1 g of the wet powder at atmospheric pressure and 150° C. for 2 hours was measured as a mass of the solid. For example, when the mass after drying was 0.4 g, the solid content was 40% by mass.

<Measurement of Residual Solvent>

The amount of the organic solvent, which was included in the polymer for lithography in the state of a dried powder or a solution obtained in the commercialization process and was used as a poor solvent in the purification process, was obtained as the amount of a residual solvent. In other words, by performing a gas chromatography of the sample prepared by the following preparing method under the following conditions (GC conditions), the content of the poor solvent (the amount of the residual solvent) used in the purification process was obtained by an internal standard method.

[Method of Manufacturing Sample]

(1) in the case of a polymer for lithography in a state of a dried powder: 5 mL of acetonitrile was added to 0.1 g of the polymer and then left at 25° C. for 12 hours, and then 0.98 mL of the supernatant sampled was added with 20 μL of the solution of 1% n-butyl alcohol that is an internal standard to obtain the solution as a sample. The amount of the residual solvent (unit: % by mass) is a rate when being measured with respect to 100% by mass of the solid of the polymer.

(2) in the case of a polymer for lithograph in a solution state: the polymer in a solution state (including a concentrated solution state) was used as a sample. The amount of the residual solvent (unit: % by mass) measured by the above-described method is a rate when being measured with respect to 100% by mass of the solid of the polymer.

[GC Conditions]

Apparatus: Agilent Technologies 6890 (Trade Name) manufactured by Agilent Technologies, Inc.

Carrier gas: He

Total flow rate: 24 mL/min.

Separation column: HP-INNWAX (Trade Name), which is a length of 30 m×an internal diameter of 0.32 mm×a film thickness of 0.25 μm, manufactured by Agilent Technologies Inc.

Flow rate of column: 1.5 mL/min. (40° C.)

Column temperature increasing condition: 50° C. (maintained for 10 min.)→(Temperature raised by 10° C./min.)→110° C. (maintained for 9 min.)

Temperature of inlet: 230° C.

Temperature of detection hole: 230° C.

Detector: hydrogen flame ionization detector (FID)

Injection amount: 1

<Measurement of Residual Monomer>

The amount of the residual monomer of the polymer for lithography in the state of a dried powder or a solution (including a concentrated solution state) obtained in the commercialization process was obtained by the following method.

0.5 g of the polymer for lithography in the state of a dried powder or a solution was taken, and then diluted with acetonitrile to make the total amount of the diluted polymer to be 50 mL using a measuring flask. The diluted solution was filtered with 0.2 μm membrane filter, and the content of the unreacted monomer in the diluted solution for each of the monomers was obtained by using a high speed liquid chromatography HPLC-8020 (Product Name) manufactured by Tosoh Corporation. The mass ratio (% by mass) of the polymer of the total amount of the monomers was defined as the content of the residual monomers in the polymer. As detection lower limit or less, the amount of the residual monomers was defined as 0% by mass.

The amount of the residual monomers (Unit: % by mass) measured by the method was the ratio when being measured with respect to 100% by mass of the solid mass of the polymer for lithography in the state of a dried powder or the polymer for lithography in a solution state obtained in the commercialization process.

As the separation column in the measurement by the high speed liquid chromatography, one Inertsil ODS-2 (Trade name) manufactured by GL Sciences Inc. was used, and the measurement was performed by using the gradient system of water/acetonitrile as a mobile phase, 0.8 mL/min of a flow rate, an ultraviolet·visible photometer, UV-8020 (Trade Name) manufactured by Tosoh Corporation as a detector, 220 nm of a detection wavelength, a measurement temperature of 40° C., and 4 μL of an injection amount. In addition, an separation column, that is, Inertsil ODS-2 (Trade Name) having a silica gel diameter of 5 μm, and 4.6 mm of a column internal diameter×450 mm of a column length was used. In addition, as a gradient condition of a mobile phase, water as A solution and acetonitrile as B solution were used and the following conditions were used. In addition, in order to quantify the content of the monomer, three kinds of the monomer solutions having different concentrations each other were used as a standard solution.

Measurement time of 0 to 3 min: A solution/B solution=90 vol %/10 vol %

Measurement time of 3 to 24 min: from A solution/B solution=90 vol %/10 vol % to A solution/B solution=50 vol %/50 vol %

Measurement time of 24 to 36.5 min: from A solution/B solution=50 vol %/50 vol % to A solution/B solution=0 vol %/100 vol %

Measurement time of 36.5 to 44 min: A solution/B solution=0 vol %/100 vol %

<Evaluation of Resist Composition>

[Measurement of Sensitivity and Developing Contrast]

The resist composition was spin-applied on a silicon wafer of 6 inches and was subjected to a pre-baking (PAB) at 120° C. on a hot plate for 60 seconds to form a thin film having a thickness of 300 nm. The thin film was subjected to the light exposure with 18 shots of 10 mm×10 mm$^2$ by changing the amount of light exposure using an ArF excimer laser exposure equipment (VUVES-4500 (Trade Name) manufactured by Litho Tech Japan Corporation). Subsequently, the thin film was subjected to a post-baking (PEB) at 110° C. for 60 seconds, and then, developed with an aqueous solution of 2.38% by mass tetramethyl ammonium hydroxide at 23° C. for 65 seconds using a resist developing analyzer (RDA-800 (Trade Name) manufactured by Litho Tech Japan Corporation). And then, for the respective amounts of the light exposure, the changes according to the elapsed time of the resist film thickness during the developing were measured.

[Analysis]

A curve (hereinafter, referred to as "the amount of light exposure–residual film rate curve") plotting a residual film thickness rate (hereinafter, referred to as "residual film rate") (%) at the time of developing for 60 seconds to the logarithm of the amount of light exposure (mJ/cm$^2$) and initial thickness based on the obtained data were made, and then Eth sensitivity (representing the amount of light exposure required for 0% of the residual film rate, that is, sensitivity) was obtained as follows. As the Eth sensitivity is low, the sensitivity of the resist composition is high and favorable.

Eth sensitivity: the amount of light exposure (mJ/cm$^2$) that crosses 0% of the residual film rate for the curve of the amount of light exposure–residual film rate Example 1

242.0 g of ethyl lactate was added in a flask (polymerization vessel) having the volume of 1 L manufactured by SUS, which has a nitrogen inlet, a stirrer, a condenser, one dripping funnel, and a thermometer. The inside of the flask was substituted with nitrogen, put into a hot water bath while being maintained at a nitrogen atmosphere, and then while being stirred in the flask, the temperature of the ethyl lactate in the flask was raised by 80° C.

Since then, the following Compound 1 was dropped to the inside of the flask through the dripping funnel over 4 hours, and then the temperature of 80° C. was maintained for 3 hours.

After that, the reactant in the flask was cooled by 25° C. for stopping the polymerization reaction to obtain the polymerization reaction solution [Polymerization process].

[Compound 1]
102.00 g of the monomer of the following Equation m1
117.60 g of the monomer of the following Equation m2
70.80 g of the monomer of the following Equation m3
435.6 g of ethyl lactate
8.280 g of dimethyl-2,2'-azobis isobutyrate (V601 (Trade Name) manufactured by Wako Pure Chemical Industries Ltd.)

Blending rate (mol %) of each of the monomers of (m1)/(m2)/(m3)=40/40/20

[Chemical Formula 1]

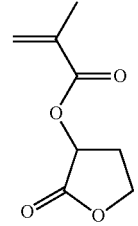

(m1)

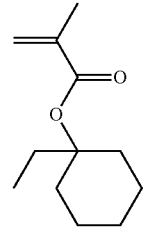

(m2)

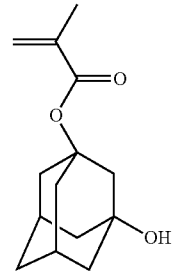

(m3)

The polymer (white precipitate) was precipitated by dropping the obtained polymerization reaction solution in the amount of 7.0 times (based on mass) of a poor solvent while the poor solvent was stirred. As the poor solvent, the mixed solvent of methanol and water (volumetric ratio of methanol/water=80/20) was used.

While being stirred, the liquid including the precipitate was heated to be 40° C., maintained for 30 minutes, and then cooled to be 25° C. The solid-liquid separation of the cooled precipitate was started by using the method of filtering with a pressure filter. The inside of the pressure filter was pressurized with dried nitrogen passed through 0.1 μm filter at 150 kPa (filtration differential pressure), and a filter cloth made of polyester was used as a pressure filtration material. At 15 minutes after starting, the poor solvent subjected to a deliquoring did not continuously flow out from the cake, and at the above state, the pressure state was maintained at 150 kPa for 30 minutes to obtain a wet powder. The measured solid content of the wet powder was 45% by mass [Re-precipitation process].

Since then, the wet powder in the pressure filter was in contact with a rinsing solvent (volumetric ratio of methanol/water=80/20) by spraying the rinsing solvent from a spray nozzle that supplies a supplied solution (rinsing solvent) of an average particle diameter of 590 μm in order to wash the wet powder. The rinsing solvent was controlled to be at a temperature of 20° C., and the rinsing solvent was sprayed in a half amount of the polymerization reaction solution.

Next, the inside of the pressure filter was pressurized using dried nitrogen passed through 0.1 μm filter at 150 kPa (filtration differential pressure), and the deliquoring of the rinsing solution was started. A filter cloth made of polyester was used as a pressure filtration material. At 5 minutes after starting, the rinsing solvent subjected to the deliquoring did not continuously flow out from the cake, and at the above state, the pressure state was maintained at 150 kPa for 30 minutes to obtain a wet powder (wet powder after rinsing). The measured solid content of the wet powder was 47% by mass [Rinsing process after re-precipitation process]

Since then, the wet powder after rinsing was again mixed with 7.0 times (based on mass) amount of a poor solvent with respect to the polymerization reaction solution, and then a re-slurry operation was performed. As a poor solvent, the mixed solvent of methanol and water (volumetric ratio of methanol/water=85/15) was used.

While being stirred, the solution including the wet powder was heated to be 40° C., was maintained for 30 minutes, and then was cooled to be 25° C. The cooled precipitate was subjected to a solid-liquid separation by using the method of filtering in a pressure filter. The inside of the pressure filter was pressurized using dried nitrogen passed through 0.1 μm filter at 150 kPa (filtration differential pressure), and a filter cloth made of polyester was used as a pressure filtration material. At 15 minutes after starting, the poor solvent subjected to the deliquoring did not continuously flow out from the cake, and at the above state, the pressure state was maintained at 150 kPa for 30 minutes to obtain a wet powder. The measured solid content of the wet powder was 49% by mass [Re-slurry process].

Since then, the wet powder in the pressure filter was again subjected to a rinsing process in the same as the rinsing process after the re-precipitation process, except that the mixed solution of the volumetric ratio of methanol/water=85/15 was used as a rinsing solvent. The measured solid content of the obtained wet powder (wet powder after rinsing) was 51% by mass [Rinsing process after re-slurry process].

The commercialization process was performed by using the wet powder (solid content of 51% by mass) obtained in the rinsing process after the re-slurry process as a wet powder of the purified polymer.

In other words, at the atmosphere of 25° C., 200 g of the wet powder of the purified polymer (room temperature) was dissolved in 2000 g of PGMEA (25° C.). Subsequently, the obtained solution was filtered with a cartridge filter having a hole diameter of 0.04 μm, which is made of nylon. The obtained filtrate was concentrated at a pressure of 20 kPa and a temperature of 50° C., and then, at the point of not flowing effluent out, after the condition was changed into a pressure of 3 kPa and a temperature of 65° C., the obtained filtrate was concentrated until the solid content was to be 25% by mass to obtain a concentrated polymer for lithography in a liquid state [Commercialization process].

The dissolving time was measured when 200 g of the wet powder (25° C.) of the purified polymer was dissolved in 2000 g of PGMEA (25° C.) that is a good solvent in the commercialization process. In detail, the total amount of the wet powder of the purified polymer was added in a good solvent in quantity, stirred by using the method of rotating a stirring bar at a rotation speed of 200 rpm using a stirrer, and then dissolved. The starting point of the dissolving time was defined as the point of adding the wet powder to a good solvent and the ending point was defined as the point of being the homogeneous solution without a polymer solid that was confirmed with the naked eye. The results are listed in Table 1 (the same hereinafter).

The weight average molecular weight (Mw) and molecular weight distribution (Mw/Mn) of the polymer in the obtained concentrated solution (PGMEA solution) were measured by using the above-described method. The results are listed in Table 1 (the same hereinafter).

In addition, the amount of the residual monomers and the amount of the residual solvent in the obtained concentrated solution (PGMEA solution) were measured by using the above-described method. The results are listed in Table 1 (the same hereinafter).

Table 1 exhibits the solid contents of the wet powders obtained in the respective process and the main preparation conditions (the same hereinafter).

[Evaluation of Resist Composition]

The resist composition was prepared by using the obtained concentrated solution. In other words, 2 parts of triphenylsulfonium triflate that is a photo acid generator was added to 400 parts of the concentrated solution, PGMEA that is a solvent was further mixed therewith to be a homogenous solution having a solid content of 12.5% by mass, and then filtered with a membrane filter having a hole diameter of 0.1 μm to obtain a resist composition. Eth sensitivity of the obtained resist composition was measured by using the above-described method. The results are listed in Table 1.

Example 2

In the present Example, as the method of shortening the pressure time of the pressure filter with respect to Example 1, the solid contents of the wet powders after the pressure filtration were decreased as listed in Table 1.

In other words, the polymer for lithography in a concentrated liquid state was prepared in the same as Example 1, except that the pressure time of the pressure filter was changed to be 35% by mass of the solid content of the wet powder obtained in the re-precipitation process, the pressure time of the pressure filter was changed to be 35% by mass of the solid content of the wet powder obtained in the rinsing process after the re-precipitation process, and the pressure time of the pressure filter was changed to be 35% by mass of the solid content of the wet powder obtained in the re-slurry process, for Example 1.

Mw, Mw/Mn, the amount of the residual monomers, and the amount of the residual solvent were measured in the same in Example 1, and then the sensitivities of the resist compositions were evaluated.

Example 3

In the present Example, with respect to Example 1, the temperature of the wet powder was set to be high until the wet powder of the purified polymer obtained in the purification process was dissolved in a good solvent.

In other words, the wet powder (the solid content of 51% by mass) of the purified polymer was obtained by performing the rinsing process after the re-slurry process in the same method as Example 1.

200 g of the wet powder obtained in the commercialization process was maintained at the atmosphere of 45° C. for 1 hour, and then dissolved in 2000 g of PGMEA (25° C.). Subsequently, the obtained solution was filtered with a cartridge filter having a hole diameter of 0.04 μm, which is made of nylon. The obtained filtrate was concentrated at a pressure of 20 kPa and a temperature of 50° C., and then, at the point of not flowing effluent out, after the condition was changed into a pressure of 3 kPa and a temperature of 65° C., the obtained filtrate was concentrated until the solid content was set to be 25% by mass to obtain a concentrated polymer for lithography in a liquid state [Commercialization process].

Mw, Mw/Mn, the amount of the residual monomers, and the amount of the residual solvent were measured in the same in Example 1, and then the sensitivities of the resist compositions were evaluated.

Example 4

In the present Example, while the filtration differential pressure of the pressure filter was to be high in the purification process with respect to Example 1, the pressure time was shortened such that the solid content of the wet powder after the pressure filtration was to be the same as listed in Table 1.

In other words, the polymerization reaction solution was obtained by performing the polymerization process in the same as Example 1.

In Example 1, all of the filtration differential pressure in the re-precipitation process, the filtration differential pressure in the rinsing process after the re-precipitation process, the filtration differential pressure in the re-slurry process, and the filtration differential pressure in the rinsing process after the re-slurry process were changed to be 200 kPa.

In other words, the polymer (white precipitation) was precipitated by dropping the obtained polymerization reaction solution in 7.0 times amount (based on mass) of a poor solvent while the poor solvent was stirred. As the poor solvent, the mixed solvent of methanol and water (volumetric ratio of methanol/water=80/20) was used.

While being stirred, the liquid including the precipitate was heated to be 40° C., maintained for 30 minutes, and then cooled to be 25° C. The solid-liquid separation of the cooled precipitate was started by using the method of filtering with a pressure filter. The inside of the pressure filter was pressurized with dried nitrogen passed through 0.1 μm filter in 200 kPa (filtration differential pressure), and a filter cloth made of polyester was used as a pressure filtration material. At 12 minutes after starting, the poor solvent subjected to a deliquoring did not continuously flow out from the cake, and at the above state, the pressure state was maintained at 200 kPa for 20 minutes to obtain a wet powder. The measured solid content of the wet powder was 49% by mass [Re-precipitation process].

Since then, the wet powder in the pressure filter was in contact with a rinsing solvent (volumetric ratio of methanol/water=80/20) by spraying the rinsing solvent from a spray nozzle that supplies a supplied solution (rinsing solvent) of an average particle diameter of 590 μm in order to wash the wet powder. The rinsing solvent was controlled to be a temperature of 20° C., and the rinsing solvent was sprayed in a half amount of the polymerization reaction solution.

Next, the inside of the pressure filter was pressurized using dried nitrogen passed through 0.1 μm filter at 200 kPa (filtration differential pressure), and the deliquoring of the rinsing solution was started. A filter cloth made of polyester was used as a pressure filtration material. At 5 minutes after starting, the rinsing solvent subjected to the deliquoring did not continuously flow out from the cake, and at the above state, the pressure state was maintained at 200 kPa for 20 minutes to obtain a wet powder (wet powder after rinsing). The measured solid content of the wet powder was 49% by mass [Rinsing process after re-precipitation process].

Since then, the wet powder after rinsing was again mixed with 7.0 times (based on mass) amount of a poor solvent with respect to the polymerization reaction solution, and then a re-slurry operation was performed. As a poor solvent, the mixed solvent of methanol and water (volumetric ratio of methanol/water=85/15) was used.

While being stirred, the solution including the wet powder was heated to be 40° C., was maintained for 30 minutes, and then was cooled to be 25° C. The cooled precipitate was subjected to a solid-liquid separation by using the method of filtering in a pressure filter. The inside of the pressure filter was pressurized using dried nitrogen passed through 0.1 μm filter at 200 kPa (filtration differential pressure), and a filter cloth made of polyester was used as a pressure filtration material. At 12 minutes after starting, the poor solvent subjected to the deliquoring did not continuously flow out from the cake, and at the above state, the pressure state was maintained at 200 kPa for 20 minutes to obtain a wet powder. The measured solid content of the wet powder was 51% by mass [Re-slurry process].

Since then, the wet powder in the pressure filter was again subjected to a rinsing process in the same as the rinsing process after the re-precipitation process, except that the mixed solution of the volumetric ratio of methanol/water=85/15 was used as a rinsing solvent. The measured solid content of the obtained wet powder (wet powder after rinsing) was 51% by mass [Rinsing process after re-slurry process].

The commercialization process was performed in the same as Example 1 using the wet powder (the solid content of 51% by mass) obtained in the rinsing process after the re-slurry process as a wet powder of the purified polymer.

Mw, Mw/Mn, the amount of the residual monomers, and the amount of the residual solvent were measured in the same in Example 1, and then the sensitivities of the resist compositions were evaluated.

Example 5

In the present Example, the conditions of the purification process were changed as follows using the monomers different from that of Example 1.

In other words, the polymerization process was performed in the same as Example 1, except that 261.0 g of PGMEA was used as a polymerization solvent and the monomer mixture was changed with the following Compound 2 in the polymerization process of Example 1 [Polymerization process].

[Compound 2]
102.00 g of the monomer of the above Formula m1
140.40 g of the monomer of the above Formula m4
70.80 g of the monomer of the above Formula m3
469.8 g of PGMEA
22.425 g of dimethyl-2,2'-azobis isobutyrate (V601 (Trade Name) manufactured by Wako Pure Chemical Industries Ltd.)

Blending rate (mol %) of each of the monomers of (m1)/(m4)/(m3)=40/40/20

[Chemical Formula 2]

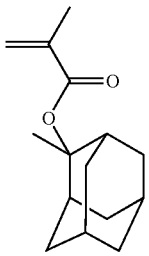

(m4)

The applied pressure in the pressure filter was changed to be 160 kPa when the solid-liquid separation was performed in the re-precipitation process of Example 1. At 13 minutes after starting the solid-liquid separation, the poor solvent subjected to a deliquoring did not continuously flow out from the cake, and at the above state, the pressure state was maintained at 160 kPa for 30 minutes to obtain a wet powder. The measured solid content of the wet powder was 46% by mass [Re-precipitation process].

Next, the wet powder was washed with a rinsing solvent in the same as Example 1. The applied pressure in the pressure filter was changed to be 160 kPa when the rinsing solvent was subjected to a deliquoring. At 5 minutes after starting the deliquoring, the poor solvent subjected to the deliquoring did not continuously flow out from the cake, and at the above state, the pressure state was maintained at 160 kPa for 25 minutes to obtain a wet powder (wet powder after rinsing). The measured solid content of the wet powder was 47% by mass [Rinsing process after re-precipitation process].

Since then, as a poor solvent, the mixed solvent of methanol and water (volumetric ratio of methanol/water=90/10) was used in the re-slurry process of Example 1, and the applied pressure in the pressure filter was changed to be 160 kPa when the solid-liquid separation was performed. At 10 minutes after starting the solid-liquid separation, the poor solvent subjected to the deliquoring did not continuously flow out from the cake, and at the above state, the pressure state was maintained at 160 kPa for 30 minutes to obtain a wet powder. The measured solid content of the wet powder was 51% by mass [Re-slurry process].

Since then, the mixed solution of the volumetric ratio of methanol/water=90/10 was used as a rinsing solvent in the rinsing process after the re-slurry process of Example 1. In addition, the applied pressure in the pressure filter was changed to be 160 kPa when the rinsing solvent was subjected to a deliquoring. At 4 minutes after starting the deliquoring, the poor solvent subjected to the deliquoring did not continuously flow out from the cake, and at the above state, the pressure state was maintained at 160 kPa for 30 minutes to obtain a wet powder. The measured solid content of the obtained wet powder was 53% by mass [Rinsing process after re-slurry process].

The commercialization process was performed using the wet powder (the solid content of 53% by mass) obtained in the rinsing process after the re-slurry process as a wet powder of the purified polymer.

In other words, 200 g of the wet powder (room temperature) of the purified polymer was dissolved in 3000 g of PGMEA at the atmosphere of 25° C.

Subsequently, the dissolved wet powder was concentrated to be 25% by mass of the solid content of the polymer in the same as Example 1 to prepare a polymer for lithography in a concentrated liquid state [Commercialization process].

Mw, Mw/Mn, the amount of the residual monomers, and the amount of the residual solvent were measured in the same in Example 1, and then the sensitivities of the resist compositions were evaluated.

Comparative Example 1

In the present Comparative Example, as the method of shortening the pressure time of the pressure filter with respect to Example 1, the solid contents of the wet powders after the pressure filtration were decreased as listed in Table 1.

In other words, the pressure time in the pressure filter was changed to be 35% by mass of the solid content of the wet powder obtained in the re-precipitation process in Example 1. The pressure time of the pressure filter was changed to be 35% by mass of the solid content of the wet powder obtained in the rinsing process after the re-precipitation process in Example 1. The pressure time of the pressure filter was changed to be 35% by mass of the solid content of the wet powder obtained in the re-slurry process in Example 1. The pressure time of the pressure filter was changed to be 35% by mass of the solid content of the wet powder obtained in the rinsing process after the re-slurry process in Example 1. Except these, the polymer for lithography in a concentrated liquid state was prepared in the same as Example 1.

Mw, Mw/Mn, the amount of the residual monomers, and the amount of the residual solvent were measured in the same in Example 1, and then the sensitivities of the resist compositions were evaluated.

Comparative Example 2

In the present Comparative Example, the filtration differential pressure of the pressure filter was to be low with respect to Example 1, and the pressure time was increased such that the solid content of the wet powder after the pressure filtration was to be the same as listed in Table 1.

In other words, the polymerization reaction solution was obtained by performing the polymerization process in the same as Example 1.

In Example 1, all of the filtration differential pressure in the re-precipitation process, the filtration differential pressure in the rinsing process after the re-precipitation process, the filtration differential pressure in the re-slurry process, and the filtration differential pressure in the rinsing process after the re-slurry process were changed to be 45 kPa.

In other words, the polymer (white precipitation) was precipitated by dropping the obtained polymerization reaction solution in 7.0 times amount (based on mass) of a poor solvent while the poor solvent was stirred. As the poor solvent, the mixed solvent of methanol and water (volumetric ratio of methanol/water=80/20) was used.

While being stirred, the liquid including the precipitate was heated to be 40° C., maintained for 30 minutes, and then cooled to be 25° C. The solid-liquid separation of the cooled precipitate was started by using the method of filtering with a pressure filter. The inside of the pressure filter was pressurized with dried nitrogen passed through 0.1 μm filter at 45 kPa (filtration differential pressure), and a filter cloth made of polyester was used as a pressure filtration material. At 30 minutes after starting, the poor solvent subjected to a deliquoring did not continuously flow out from the cake, and at the above state, the pressure state was maintained at 45 kPa for 50 minutes to obtain a wet powder. The measured solid content of the wet powder was 41% by mass [Re-precipitation process].

Since then, the wet powder in the pressure filter was in contact with a rinsing solvent (volumetric ratio of methanol/water=80/20) by spraying the rinsing solvent from a spray nozzle that supplies a supplied solution (rinsing solvent) of an average particle diameter of 590 μm in order to wash the wet powder. The rinsing solvent was controlled to be a temperature of 20° C., and the rinsing solvent was sprayed in a half amount of the polymerization reaction solution.

Next, the inside of the pressure filter was pressurized using dried nitrogen passed through 0.1 μm filter at 45 kPa (filtration differential pressure), and the deliquoring of the rinsing solution was started. A filter cloth made of polyester was used as a pressure filtration material. At 10 minutes after starting, the rinsing solvent subjected to the deliquoring did not continuously flow out from the cake, and at the above state, the pressure state was maintained at 45 kPa for 50 minutes to obtain a wet powder (wet powder after rinsing). The measured solid content of the wet powder was 40% by mass [Rinsing process after re-precipitation process].

Since then, the wet powder after rinsing was again mixed with 7.0 times (based on mass) amount of a poor solvent with respect to the polymerization reaction solution, and then a re-slurry operation was performed. As a poor solvent, the mixed solvent of methanol and water (volumetric ratio of methanol/water=85/15) was used.

While being stirred, the solution including the wet powder was heated to be 40° C., was maintained for 30 minutes, and then was cooled to be 25° C. The cooled precipitate was subjected to a solid-liquid separation by using the method of filtering in a pressure filter. The inside of the pressure filter was pressurized using dried nitrogen passed through 0.1 μm filter at 45 kPa (filtration differential pressure), and a filter cloth made of polyester was used as a pressure filtration material. At 30 minutes after starting, the poor solvent subjected to the deliquoring did not continuously flow out from the cake, and at the above state, the pressure state was maintained at 45 kPa for 50 minutes to obtain a wet powder. The measured solid content of the wet powder was 42% by mass [Re-slurry process].

Next, the wet powder in the pressure filter was again subjected to a rinsing process in the same as the rinsing process after the re-precipitation process, except that the mixed solution of the volumetric ratio of methanol/water=85/15 was used as a rinsing solvent. The measured solid content of the obtained wet powder (wet powder after rinsing) was 41% by mass [Rinsing process after re-slurry process].

The commercialization process was performed in the same as Example 1 using the wet powder (the solid content of 41% by mass) obtained in the rinsing process after the re-slurry process as a wet powder of the purified polymer.

Mw, Mw/Mn, the amount of the residual monomers, and the amount of the residual solvent were measured in the same in Example 1, and then the sensitivities of the resist compositions were evaluated.

Comparative Example 3

In the present Comparative Example, as the method of increasing the pressure time of the pressure filter with respect to Example 1, the solid contents of the wet powders after the pressure filtration were increased as listed in Table 1.

In other words, the wet powder was obtained by performing the polymerization process and re-precipitation process, and again performing the re-precipitation process in the same as Example 1.

The filtration was performed in the state of allowing all of the filtration differential pressure in the re-slurry process and the filtration differential pressure in the rinsing process after the re-slurry process to be 150 kPa with respect to Example 1, and the maintaining time after the filtration was changed.

In other words, by using the method of filtering the precipitate obtained in the re-slurry process in a pressure filter, the inside of the pressure filter was pressurized using dried nitrogen passed through 0.1 μm filter at 150 kPa (filtration differential pressure), and a filter cloth made of polyester was used as a pressure filtration material. At 15 minutes after starting, the poor solvent subjected to the deliquoring did not continuously flow out from the cake, and at the above state, the pressure state was maintained at 150 kPa for 150 minutes to obtain a wet powder. The measured solid content of the wet powder was 65% by mass [Re-slurry process].

Next, the deliquoring of the rinsing solution was started by performing the rinsing process in the same as Example 1. At 10 minutes after starting, the rinsing solvent subjected to the deliquoring did not continuously flow out from the cake, and at the above state, the pressure state was maintained at 150 kPa for 240 minutes to obtain a wet powder (wet powder after rinsing). The measured solid content of the obtained wet powder (wet powder after rinsing) was 70% by mass [Rinsing process after re-slurry process].

The commercialization process was performed in the same as Example 1 using the wet powder (the solid content of 70% by mass) obtained in the rinsing process after the re-slurry process as a wet powder of the purified polymer.

Mw, Mw/Mn, the amount of the residual monomers, and the amount of the residual solvent were measured in the same in Example 1, and then the sensitivities of the resist compositions were evaluated.

Comparative Example 4

In the present Comparative Example, as the method of shortening the pressure time of the pressure filter with respect to Example 5, the solid contents of the wet powders after the pressure filtration were decreased as listed in Table 1.

In other words, the pressure time of the pressure filter was changed to be 32% by mass of the solid content of the wet powder obtained in the re-precipitation process with respect to Example 5. The pressure time of the pressure filter was changed to be 34% by mass of the solid content of the wet powder obtained in the rinsing process after the re-precipitation process in Example 5. The pressure time of the pressure filter was changed to be 32% by mass of the solid content of the wet powder obtained in the re-slurry process with respect to Example 5. The pressure time of the pressure filter was changed to be 34% by mass of the solid content of the wet powder obtained with respect to the rinsing process after the re-slurry process with respect to Example 5. Except these, the polymer for lithography in a concentrated liquid state was prepared in the same as Example 5.

Mw, Mw/Mn, the amount of the residual monomers, and the amount of the residual solvent were measured in the same in Example 1, and then the sensitivities of the resist compositions were evaluated.

TABLE 1

|  | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Filtration differential pressure in re-precipitation process [kPa] | 150 | 150 | 150 | 200 | 160 | 150 | 45 | 150 | 160 |
| Solid content of wet powder obtained in re-precipitation process [% by mass] | 45 | 35 | 45 | 49 | 46 | 35 | 41 | 45 | 32 |
| Filtration differential pressure in rinsing process after re-precipitation process [kPa] | 150 | 150 | 150 | 200 | 160 | 150 | 45 | 150 | 160 |
| Solid content of wet powder obtained in rinsing process after re-precipitation process [% by mass] | 47 | 35 | 47 | 49 | 47 | 35 | 40 | 47 | 34 |
| Filtration differential pressure in re-slurry process [kPa] | 150 | 150 | 150 | 200 | 160 | 150 | 45 | 150 | 160 |
| Solid content of wet powder obtained in re-slurry process [% by mass] | 49 | 35 | 49 | 51 | 51 | 35 | 42 | 65 | 32 |
| Filtration differential pressure in rinsing process after re-slurry process [kPa] | 150 | 150 | 150 | 200 | 160 | 150 | 45 | 150 | 160 |
| Solid content of wet powder obtained in rinsing process after re-slurry process [% by mass] | 51 | 51 | 51 | 51 | 53 | 35 | 41 | 70 | 34 |
| Temperature of wet powder until being dissolved in good solvent [° C.] | 25 | 25 | 45 | 25 | 25 | 25 | 25 | 25 | 25 |
| Dissolving time of wet powder in good solvent [min] | 26 | 27 | 37 | 23 | 36 | 35 | 29 | 26 | 58 |
| Weight average molecular weight of polymer (Mw) | 10400 | 10400 | 10400 | 10400 | 10700 | 10300 | 10200 | 10400 | 10600 |
| Molecular weight distribution of polymer (Mw/Mn) | 1.68 | 1.69 | 1.69 | 1.68 | 1.77 | 1.70 | 1.72 | 1.68 | 1.78 |
| Amount of residual monomers [% by mass] | 0.034 | 0.043 | 0.034 | 0.044 | 0.019 | 0.061 | 0.081 | 0.033 | 0.029 |
| Amount of residual solvent [% by mass] | 0.016 | 0.022 | 0.013 | 0.019 | 0.023 | 0.075 | 0.072 | 0.016 | 0.045 |
| Sensitivity of resist composition [mJ/cm$^2$] | 1.02 | 1.02 | 1.05 | 1.08 | 2.70 | 1.10 | 1.11 | 1.02 | 2.90 |
| Productivity | A | A | A | A | A | A | B | C | A |

As listed in Table 1, Examples 1 to 5 are examples that the solid contents of the wet powders (wet powders of the purified polymers) obtained in the rinsing process after the re-slurry process that is a final process in the purification process, that is, the wet powders used for the commercialization process, exceed 40% by mass.

Comparative Examples 1 and 4 are examples that the solid contents of the wet powders of the purified polymers are 40% by mass or less.

When Examples 1 and 2 are compared with Comparative Example 1, it can be seen that in the cases of Examples 1 and 2, the amount of the residual monomers and the amount of the residual solvent are low and sensitivities of the resist compositions are excellent.

In addition, when Example 5 is compared with Comparative Example 4, it can be seen that in the case of Example 5, the amount of the residual monomers and the amount of the residual solvent are low and sensitivity of the resist composition is excellent.

Especially, when Example 2 is compared with Comparative Example 1, it can be seen that when the solid content of the wet powder obtained in the final process of the purification process exceeds 40% by mass, the amount of the residual monomers and the amount of the residual solvent are decreased, and sensitivity of the resist composition is improved. In addition, when Example 1 and Example 2 are compared each other, it can be seen that when the solid contents of the wet powders obtained in the total processes of the purification process exceed 40% by mass, the amount of the residual monomers and the amount of the residual solvent are further decreased.

As described above, according to the invention, the amount of the residual monomers and the amount of the residual solvent can be decreased and high purity polymer for lithography can be obtained, without adding new process to the purification process.

When Examples 1 and 2 are compared with Example 3, it can be seen that in the cases of Examples 1 and 2, in which the temperatures of the wet powders are 25° C. until being dissolved in a good solvent, the dissolving time is short when the wet powders of the purified polymers are dissolved in a good solvent, and sensitivities of the resist compositions are excellent, as compared with the case of Example 3, in which the temperature is 45° C. It means that as the time of dissolving the wet powder in a good solvent is short; the polymer exhibiting excellent performance can be obtained because the time of passing through the process is short and stabilized.

When Examples 1 and 2 are compared with Example 4, it can be seen that all the solid contents of the wet powders (wet powders of the purified polymers) obtained in the rinsing process after the re-slurry process that is a final step of the purification process, that is, the wet powders used for the commercialization process, are the same as 51% by mass. Since Example 4 having high filtration differential pressure in each of the processes exhibits short time of dissolving the wet powder of the purified polymer in a good solvent and high filtration differential pressure, the filtration time to be 51% by mass becomes also short. However, since the cases of Examples 1 and 2 exhibiting low filtration differential pressure in each of the processes effectively decrease the residual monomers, the sensitivities of the resist compositions are excellent. For this reason, it can be seen that according to the method of manufacturing a polymer according to the invention, the polymer exhibiting stable and excellent performance can be effectively prepared.

For Comparative Example 2, since the filtration differential pressure in each of the processes is low, that is, 45 kPa, the filtration time is significantly required in order to improve the solid content of the wet powder. In addition, it is confirmed that since the filtration efficiency is bad, the lithography performance is decreased because of having a great quantity of the residual monomers.

Comparative Example 3 is an example that the solid content of the wet powder (wet powder of the purified polymer) obtained in the rinsing process after the re-slurry process that is a final process in the purification process, that is, the wet powder used for the commercialization process, is 65% by mass or more. In the case of Comparative Example 3, the maintaining time (the time of applying pressure) after the filtration was long; the time of passing through the process that was set as the filtration time and the time of dissolving in a good solvent was the longest; and productivity was inferior, as compared with Examples 1 to 5 and Comparative Examples 1 to 4.

In addition, for the evaluation of productivity, when the sum of the time (the time from the start of the deliquoring to the end of the filtration to obtain a wet powder) required for the pressure filtration in each of the process is less than 200 minutes, it is defined as A; when it is more than 200 minutes and less than 300 minutes, it is defined as B; and when it exceeds 300 minutes, it is defined as C, and then listed in Table.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

The invention claimed is:

1. A method of manufacturing a polymer for lithography, comprising:
   polymerizing one or more monomers in the presence of a polymerization solvent, to obtain a polymerization reaction solution comprising a polymer;
   purifying the polymer in the polymerization reaction solution by re-precipitation, to obtain a wet powder of a purified polymer; and
   dissolving the wet powder of the purified polymer in a good solvent;
   wherein:
   the purifying comprises filtering at a filtration differential pressure of 50 kPa or more;
   a solid content of the wet powder of the purified polymer exceeds 40% by mass and is less than 65% by mass; and
   a temperature of the wet powder is 40° C. or less until the wet powder of the purified polymer is dissolved in the good solvent.

2. The method of claim 1, wherein the purifying comprises re-precipitation by mixing the polymerization reaction solution and a poor solvent, and performing a solid-liquid separation through a filtration to obtain the wet powder.

3. The method of claim 2, further comprising obtaining the wet powder by performing one or more times of one or both of (i) a rinsing process by contacting the wet powder after the solid-liquid separation with a rinsing solvent, and then performing a deliquoring of the rinsing solvent through a filtration, and (ii) a re-slurry process by mixing the wet powder after the solid-liquid separation or the wet powder after the rinsing with the poor solvent, and then performing the solid-liquid separation through the filtration.

4. The method of claim 2, wherein the filtration is performed under a nitrogen atmosphere.

5. The method of claim 4, wherein the filtration performed under the nitrogen atmosphere is a pressure filtration.

6. A method of manufacturing a resist composition, the method comprising performing the method of claim 1 to obtain a polymer; and then mixing the obtained polymer and a compound generating acid by an irradiation of active rays and radiation.

7. A method of manufacturing a substrate having a pattern, the method comprising performing the method of claim 6 to obtain a resist composition; forming a resist film by applying the obtained resist composition on a side to be processed of a substrate; exposing the resist film to light to obtain an exposed resist film; and developing the exposed resist film using a developer.

8. The method of claim 3, wherein the filtration is performed under a nitrogen atmosphere.

9. The method of claim 8, wherein the filtration performed under the nitrogen atmosphere is a pressure filtration.

* * * * *